(12) United States Patent
Blaser

(10) Patent No.: US 6,353,348 B1
(45) Date of Patent: Mar. 5, 2002

(54) PHASE LOCKED LOOPS INCLUDING ANALOG MULTIPLIER NETWORKS THAT CAN PROVIDE CONSTANT LOOP BANDWIDTH

(75) Inventor: Robert J. Blaser, Evington, VA (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/671,423

(22) Filed: Sep. 27, 2000

Related U.S. Application Data

(63) Continuation of application No. 09/165,481, filed on Oct. 2, 1998, now Pat. No. 6,150,857.

(51) Int. Cl.[7] .................................................. H03L 7/06
(52) U.S. Cl. ........................... 327/156; 327/159; 331/17; 331/25
(58) Field of Search ................................ 327/156, 159, 327/160; 331/1 R, 17, 25, 34

(56) References Cited

U.S. PATENT DOCUMENTS

| | | | | |
|---|---|---|---|---|
| 4,628,270 A | * | 12/1986 | Roberts | 329/50 |
| 4,647,874 A | * | 3/1987 | Rittenbach | 331/11 |
| 4,950,923 A | * | 8/1990 | Garuts | 327/94 |
| 4,998,217 A | * | 3/1991 | Holcomb et al. | 364/573 |
| 5,748,125 A | * | 5/1998 | Cederbaum et al. | 341/136 |
| 6,150,857 A | * | 11/2000 | Blaster | 327/156 |

* cited by examiner

Primary Examiner—Timothy P. Callahan
Assistant Examiner—An T. Luu
(74) Attorney, Agent, or Firm—Myers Bigel Sibley & Sajovec

(57) ABSTRACT

Phase locked loops include an analog multiplier network, wherein the loop filter and the analog multiplier network are serially connected between the phase detector and the controlled oscillator of the phase locked loop. The analog multiplier network does not require an external network or digital signals from a digital bus. The analog multiplier network can provide an analog linearizer that equalizes the loop bandwidth of the phase locked loop as a function of frequency. More specifically, the analog multiplier network equalizes the loop bandwidth of the phase locked loop as a function of frequency, to provide constant loop bandwidth for the phase locked loop as a function of frequency.

13 Claims, 2 Drawing Sheets

PHASE LOCKED LOOPS INCLUDING ANALOG MULTIPLIER NETWORKS THAT CAN PROVIDE CONSTANT LOOP BANDWIDTH

This application is a continuation of Ser. No. 09/165,481 filed Oct. 2, 1998, U.S. Pat. No. 6,150,857.

FIELD OF THE INVENTION

This invention relates to electronic circuits, and more particularly to phase locked loops.

BACKGROUND OF THE INVENTION

Phase locked loops are widely used in electronic systems. For example, phase locked loops are widely used in communications systems, including but not limited to radio frequency communications systems such as radiotelephones. FIG. 1 is a block diagram illustrating a conventional phase locked loop.

Referring now to FIG. 1, a conventional phase locked loop 100 includes a controlled oscillator 102, such as a Voltage Controlled Oscillator (VCO) that is responsive to a control signal 104, to generate an output signal 106, the frequency of which is a function of the control signal. A sinusoidal phase detector 108, also referred to as a multiplier or phase comparator, is responsive to a reference frequency input signal 112 that may be provided by a reference oscillator 124. The phase detector 108 is also responsive to a divided output signal 122 that is produced by passing the output signal 106 through a divider 120 that divides the output signal 106 by a number 118, referred to as "N". The phase detector produces an error signal 114. A loop filter 116 filters the error signal 114, to thereby produce the control signal 104 that is provided to the voltage controlled oscillator 102. The design and operation of phase locked loops 100 and the individual components thereof are well known to those having skill in the art and need not be described further herein.

As the performance of electronic systems continues to improve, it may be desirable to obtain improved performance from the phase locked loop. For example, in radiotelephone communications systems, some coverage areas may be sparsely populated and may have a relatively flat geographical terrain. These areas may be covered by a wide-area coverage system, where the coverage area can be very large. A wide-area system can cover the geographical area with fewer base station sites, and can thus result in a more economical solution for implementing a radiotelephone system. In such wide area coverage systems, it may be important to have a low system noise figure, so that weaker signals can be received. In these applications, the phase locked loop noise may be a limiting factor in determining the system noise figure.

Accordingly, in many applications of phase locked loops, it may be important to lower the phase locked loop noise. More specifically, in many systems, the performance of the phase locked loop may determine the overall system performance. Phase noise performance, spurious performance and frequency settling time are three performance characteristics of a phase locked loop that can be improved and that can be significant in determining overall system performance.

As is well known to those having skill in the art, a phase locked loop includes a parameter referred to as loop bandwidth ($\omega_0$) that can greatly impact the phase noise performance, spurious performance and frequency settling time. Accordingly, the loop bandwidth may be a critical parameter within the phase locked loop that can impact phase locked loop performance and therefore impact overall system performance.

In the design of the phase locked loop, the loop bandwidth may be generally assumed to be constant. However, in actual embodiments of phase locked loops, the loop bandwidth may not be a constant as a function of frequency. Accordingly, in order to improve the performance of a phase locked loop, it may be desirable to provide a phase locked loop that has a constant looped bandwidth as a function of frequency.

One attempt at providing a phase locked loop having a constant loop bandwidth as a function of frequency is described in U.S. Pat. No. 4,313,209 to Drucker, entitled "Phase-Locked Loop Frequency Synthesizer Including Compensated Phase and Frequency Modulation", the disclosure of which is hereby incorporated herein by reference. Disclosed is a phase locked loop wherein the transfer characteristic of the main loop phase detector is controlled to maintain a constant loop bandwidth. Compensation for carrier frequency-related variations in the gain factors associated with the loop voltage controlled oscillator and compensation for changes in the loop frequency division ratio, as well as compensation for variations caused by frequency-sensitive networks that are embedded in the phase locked loop feedback may be provided. A digital-to-analog converter is responsive to a lookup table, to thereby provide a variable attenuator that is controlled by a parallel format digitally encoded signal, so as to equalize the system for frequency-related variations in the gain factor $K_v$ of the voltage controlled oscillator.

Unfortunately, the use of a digital-to-analog converter and lookup table to provide constant loop bandwidth may introduce problems in phase locked loops. For example, the lookup table may use an external input to the phase locked loop, which may complicate the design thereof. Moreover, the input to the digital-to-analog converter is generally a digital signal which may use a digital bus, and may thereby introduce noise into the sensitive phase locked loop.

SUMMARY OF THE INVENTION

It is therefore an object of the present invention to provide improved phase locked loops.

It is another object of the invention to provide phase locked loops that can provide constant loop bandwidth as a function of frequency.

It is another object of the present invention to provide phase locked loops that need not use digital circuits and table lookups to provide constant loop bandwidth as a function of frequency.

These and other objects are provided by phase locked loops that include an analog multiplier network, wherein the loop filter and the analog multiplier network are serially connected between the phase detector and the controlled oscillator of the phase locked loop. The analog multiplier network need not use an external input or digital signals from a digital bus. The analog multiplier network can provide an analog linearizer that equalizes the loop bandwidth of the phase locked loop as a function of frequency. More specifically, the analog multiplier network equalizes the loop bandwidth of the phase locked loop as a function of frequency, to provide constant loop bandwidth for the phase locked loop as a function of frequency.

Phase locked loops according to the invention include a controlled oscillator that is responsive to a control signal to generate an output signal. A divider divides the output signal to produce a divided output signal. A phase detector is responsive to a reference frequency input signal and to the divided signal to produce an error signal. A loop filter and an analog multiplier network are provided, wherein the loop filter and the analog multiplier are serially connected between the phase detector and the controlled oscillator.

The loop filter is preferably a two terminal loop filter having a loop filter input terminal and a loop filter output terminal. The analog multiplier network is preferably a two terminal analog multiplier network having an analog multiplier network input terminal and an analog multiplier network output terminal. The loop filter input terminal, the loop filter output terminal, the analog multiplier input terminal and the analog multiplier output terminal are serially connected between the phase detector and the controlled oscillator.

A preferred embodiment of an analog multiplier network comprises an analog multiplier network input node, an analog multiplier output node, first through third multipliers and first through fifth resistors. The first resistor is connected between a supply voltage and the analog multiplier network output node. The second resistor is connected between the analog multiplier network input node and the analog multiplier network output node. The first multiplier and third resistor are serially connected between the analog multiplier network input node and the analog multiplier network output node. The second multiplier and the fourth resistor are serially connected between the analog multiplier network input node and the analog multiplier network output node. The third multiplier and the fifth resistor are serially connected between the first multiplier output terminal and the analog multiplier network output node. The first multiplier output terminal also is connected to the second multiplier. Accordingly, the analog multiplier network can synthesize a fourth order polynomial that can compensate for nonlinearities in the loop bandwidth of the phase locked loop, to thereby provide constant loop bandwidth as a function of frequency.

More specifically, the divider divides the output signal by a number N that varies as a function of frequency, and the controlled oscillator has a controlled oscillator sensitivity $K_v$ that varies as a function of frequency. The analog multiplier network compensates for variation of $K_v/N$ as a function of frequency. Thus, the analog multiplier network operates as an analog linearizer that equalizes the loop bandwidth as a function of frequency, wherein the loop filter and the analog linearizer are serially connected between the phase detector and the controlled oscillator. By providing constant loop bandwidth for the phase locked loop as a function of frequency, low noise, high performance phase locked loops may be provided, with low phase noise, low spurious noise and rapid frequency settling time. Moreover, by providing constant loop bandwidth and thus, less varying performance versus frequency, system designers can more accurately model system performance. This can result in a more predictable and optimized system performance.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
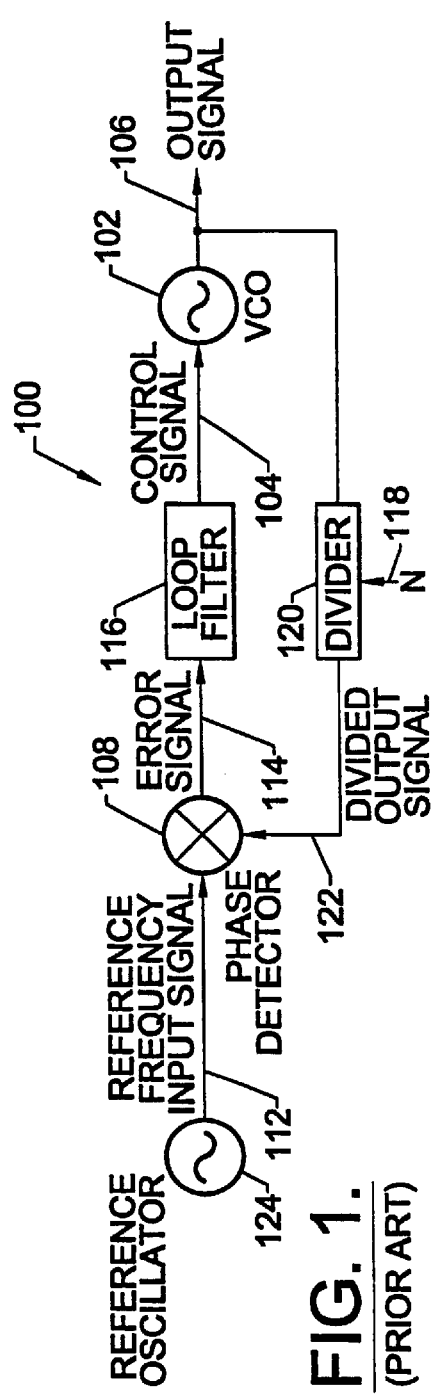
FIG. 1 is a block diagram of a conventional phase locked loop.
Figure 2:
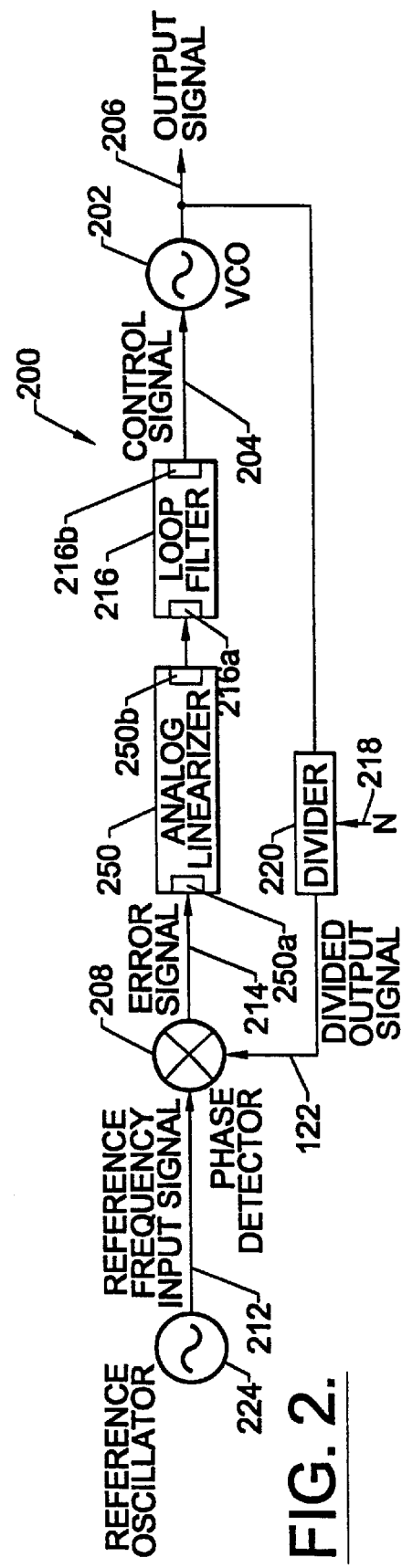
FIG. 2 is a block diagram of phase locked loops according to the present invention.

Referring now to FIG. 2, phase locked loops including analog linearizers according to the present invention will now be described. As shown in FIG. 2, phase locked loop 200 includes a controlled oscillator 202 such as a Voltage Controlled Oscillator (VCO) that is responsive to a control signal 204, to generate an output signal 206, the frequency of which is a function of the control signal. A phase detector 208, also referred to as a multiplier or phase comparator, is responsive to a reference frequency input signal 212 that may be generated by a reference oscillator 224. The phase detector 208 is also responsive to a divided output signal 122 that is produced by passing the output signal 206 through a divider 220 that divides the output signal 206 by a number 218, referred to as "N". N need not be an integer. The phase detector 208 produces an error signal 214. A loop filter 216 filters the error signal 214, to thereby produce the control signal 204 that is provided to the voltage controlled oscillator 202. The design and operation of the phase locked loop 200 as described in this paragraph, and the individual components thereof as described in this paragraph, are well known to those having skill in the art and need not be described further herein.

Still referring to FIG. 2, phase locked loops 200 according to the present invention include an analog linearizer 250. The analog linearizer equalizes the loop bandwidth as a function of frequency. As shown in FIG. 2, the loop filter 216 and the analog linearizer 250 are serially connected between the phase detector 208 and the controlled oscillator 202. As will be described in detail below, the analog linearizer 250 equalizes the loop bandwidth as a function of frequency to provide constant loop bandwidth for the phase locked loop 200 as a function of frequency.

As shown in FIG. 2, the analog linearizer 250 is a two terminal analog linearizer having an analog linearizer input terminal 250a and an analog linearizer output terminal 250b. External control, such as by a lookup table, need not be provided. Moreover, by eliminating the need for a digital lookup table and a digital-to-analog converter, a digital signal bus need not be supplied in the forward loop of the phase locked loop, so that complexity and noise may be reduced.

The loop filter 216 is also a two terminal device including a loop filter input terminal 216a and a loop filter output terminal 216b. The loop filter input terminal 216a, the loop filter output terminal 216b, the analog linearizer input terminal 250a and the analog linearizer output terminal 250b are serially connected between the phase detector 208 and the controlled oscillator 202. It will be understood that the positions of the analog linearizer 250 and the loop filter 216 may be reversed from that shown in FIG. 2.

Figure 3:
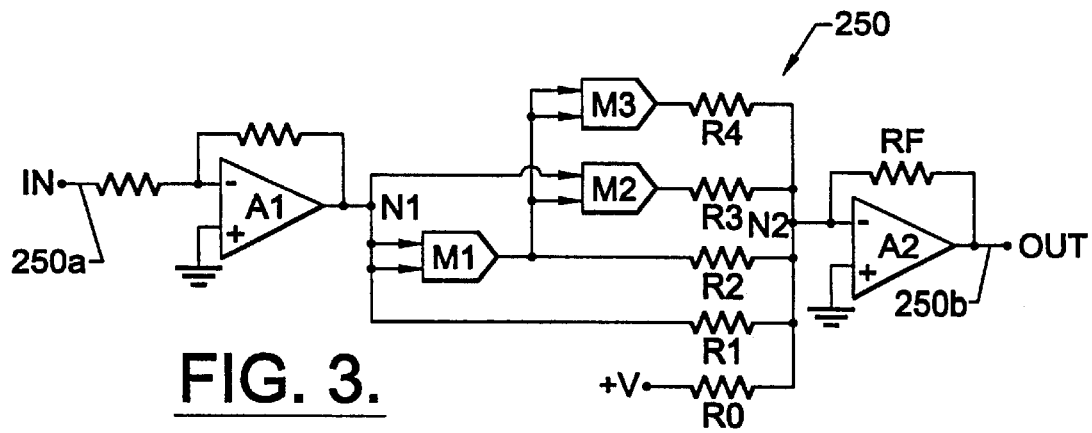
FIG. 3 is a schematic diagram of a preferred embodiment of analog linearizers according to the present invention.

FIG. 3 illustrates a preferred embodiment of an analog linearizer 250. As will be described below, the analog linearizer 250 preferably comprises an analog multiplier network that can be designed to provide a fourth order polynomial frequency response that can compensate for the nonlinear frequency response of the phase locked loop as a function of frequency, and thereby provide a constant loop bandwidth for the phase locked loop as a function of frequency.

More specifically, referring to FIG. 3, the analog multiplier network includes an analog multiplier network input node N1 and an analog multiplier network output node N2. First, second and third multipliers M1, M2 and M3 are included. Each multiplier includes a pair of input terminals and an output terminal. The multiplier multiplies the signals at the pair of input terminals to provide a signal at the output terminal that is the product of the signals at the pair of input terminals.

Five resistors R0, R1, R2, R3 and R4 are also included. The values of these resistors may be set to provide a fourth order polynomial that can compensate for the nonlinear response of the phase locked loop as a function of frequency, to thereby provide a loop bandwidth that is constant as a function of frequency.

Still referring to FIG. 3, the first resistor R0 is connected between a supply voltage+V and the analog multiplier network output node N2. The second resistor R1 is connected between the input node N1 and the output node N2 of the analog multiplier network. The first multiplier M1 and the third resistor R2 are serially connected between the input node Ni and output node N2 of the analog multiplier network. Since both inputs of the first multiplier M1 are tied to the input node N1, the first multiplier M1 provides a squaring function of the input signal on the input node N1.

The second multiplier M2 and the fourth resistor R3 are serially connected between the input node N1 and the output node N2 of the analog multiplier network. The second input of the second multiplier M2 is also connected to the output of the first multiplier M1. Thus, the inputs to multiplier M2 are the square of the signal on the input node N1 and the signal on the input node N1, so that the output of multiplier M2 provides the signal on input node N1 to the third power. Finally, the third multiplier M3 and the fifth resistor R4 are serially connected between the output of the first multiplier M1 and the output node N2. Since the output of multiplier M1 provides the signal on input node N1 squared, the output of multiplier M3 provides the signal on input node N1 to the fourth power. Accordingly, the combination of three multipliers and five resistors can provide a nonlinear fourth order polynomial function.

As shown in FIG. 3, the analog multiplier network 250 also includes a first operational amplifier A1 that is connected between the analog multiplier network terminal 250a and the analog multiplier network input node N1. A second operational amplifier A2 is connected between the output node N2 of the analog multiplier network and the output terminal 250b of the analog multiplier network. The second operational amplifier A2 includes a feedback resistor RF, the value of which can be used to scale the fourth order polynomial function as will be described below.

The design and operation of analog linearizer 250 of FIGS. 2 and 3 will now be described in detail. Phase locked loops may be designed to meet several performance specifications. These performance specifications include phase noise performance, spurious performance and settling time. The architecture of the phase locked loop can be mathematically analyzed to predict performance. Within a single loop, Type 2, fourth order topology, a mathematical analysis can be performed. The loop filter 216 may be realized with an operational amplifier to result in a third order active loop filter. The analysis may be performed by first defining the given parameters in a parameter definition step. Then, the loop filter component values may be calculated, followed by calculating loop performance. The phase locked loop may then be analyzed for phase noise, spurious performance and frequency settling time.

Within the above-described parameter definition the parameters may be assumed to be constant as a function of frequency. However, in actual phase locked loops, these parameters may vary as a function of frequency and some parameters may vary nonlinearly as a function of frequency. One parameter is the loop bandwidth ($\omega_0$). The loop bandwidth is calculated from the defined parameters and thus will generally vary as a function of frequency. Many phase locked loop designs assume a constant loop bandwidth for the phase locked loop when analyzing the phase locked loop performance. Unfortunately, the analyzed performance may be in error when assuming constant parameters versus frequency in the phase locked loop. In many systems, this error may be unacceptable.

This error may be reduced and preferably eliminated by adding an analog linearizer 250 according to the present invention, to provide a constant loop bandwidth versus frequency. A simplified relationship between the loop bandwidth and the defined parameters is as follows:

$$\omega_0 = K_T/N;$$

where $K_T = K_\psi \cdot K_{LF} \cdot K_\nu;$

N is the input 218 of the divider 220;

$K_\psi$ is the gain of the phase detector 208;

$K_{LF}$ is the gain of the loop filter 216; and $K_\nu$ is the modulation sensitivity of the controlled oscillator 202.

As can be seen from the above equation, $\omega_0$ is an inverse function of N and a direct function of $K_\nu$. In many phase locked loops, N is not a constant and varies linearly versus frequency. Also, $K_\nu$ is generally determined by the empirical performance of the VCO and may vary nonlinearly versus frequency. Modulation sensitivity ($K_\nu$) of an oscillator may be an accumulation of several factors. The factors may include circuit topology, tuning element performance and operating frequency bandwidth versus oscillator frequency bandwidth capability.

As a frequency is tuned across the frequency band, the varying N and $K_\nu$ as a function of frequency may contribute to a varying $\omega_0$ versus frequency. An analog linearizer 250 can be added to linearize the combined parameter performance as a function of frequency, and thereby result in a constant loop bandwidth versus frequency.

Figure 4:
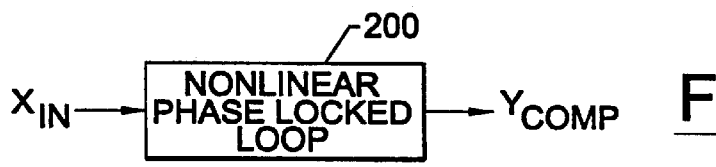
FIG. 4 is a block diagram illustrating a functional response of a nonlinear component.

As shown in FIG. 3, an analog multiplier network may be used to provide the analog linearizer 220, to thereby linearize a variety of curves. Ultra-low linearity may be achieved by using the multipliers to generate a control signal 204 that is a mirror image of the modulation sensitivity curve of the controlled oscillator 202 and other parameters (such as N) as a function of frequency. An analog controlled nonlinear component has a nonlinear functional response when a linear analog control signal is applied. Since the nonlinear functional response can be curve-fitted to a fourth order polynomial and remain within acceptable error limits, it can be linearized to result in a pseudo-linear output response for a given linear analog error signal. Specifically, the following design process may be performed:

(1) Analyze (or measure) the functional response of a nonlinear component (i.e. the phase locked loop 200) versus a linear analog signal input as shown in FIG. 4.

The transfer function of FIG. 4 may be defined as follows:

$$y_{comp} = f_{n1}(x_{in});$$

where $f_{n1}$ is the nonlinear function.

(2) Convert and scale the functional response parameter ($y_{comp}$) to an analog output parameter ($x_{out}$), wherein the analog output parameter has the same limits as the analog input parameter:

$$x_{out} = f_{n1}(x_{in});$$

where $X_{out}$ and $x_{out}$ limits are $x_{in}$ limits are $x_1$, $x_2$.

(3) Curve fit a fourth order polynomial to:

$$x_{out} = 2*f_2(x_{in}) - f_{n1}(x_{in});$$

where $f_1$ is a linear function.

(4) Synthesize the polynomial utilizing the analog multiplier network of FIG. 3. Synthesis of a polynomial using an analog multiplier network is well known to those having skill in the art and is described, for example, in an article by the present inventor entitled "Analog Multipliers Drive Component Linearizaton Scheme", Microwaves and RF, October 1992, pp. 74–80, the disclosure of which is hereby incorporated herein by reference.

(5) Input $x_{in}$ to the analog linearizer. This results in a linear functional component response ($y_{comp}$) for a linear analog input ($x_{in}$), as shown in FIG. 5.

Figure 5:
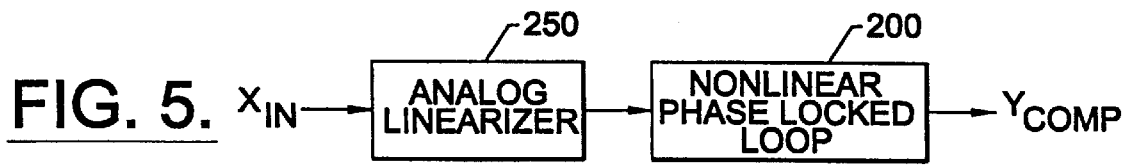
FIG. 5 is a block diagram illustrating a linear functional component response.

The transfer function for FIG. 5 is as follows:

$$y_{comp} = c * x_{in};$$

where c is a constant.

Thus, a technique for realizing the analog linearizer 250 may be summarized as follows:

(1) Empirically measure $K_v$ versus frequency.

(2) Given the divide by N frequency plan, calculate N versus frequency.

(3) Divide vector $K_v$ by vector N to obtain vector $K_{vN}$.

(4) Invert vector $K_{vN}$.

(5) Synthesize an analog linearizer to realize the resultant inverted vector $K_{vN}$.

This approach can provide a simple and inexpensive solution to produce a constant loop bandwidth versus frequency. Thus, for the VCO 202:

$$f = f_{n1}(Vt);$$

where $f_{n1}$ is a nonlinear function;

Vt is the tuning voltage (control signal 204); and f is the VCO frequency.

The frequency (f) versus tuning voltage (Vt) curve for the nonlinear VCO 202 is measured and subtracted from a linear f versus Vt curve. The difference (referred to as absolute accuracy) and the linearity are then calculated. The correction curve is then generated and curve fitted to a fourth order polynomial as follows:

Correction curve:

$$f = 2 * f_1(Vt) - f_{n1}(Vt)$$

Fourth order polynomial:

$$y = c_4 * x^4 + c_3 * x^3 + c_2 * x^2 + c_1 * x^1 + c_0;$$

where x is the tuning voltage (Vt); and $c_n$ are constants.

Linearized response:

$$f = y * (Vt) + Vt_0;$$

where $Vt_0$ is the offset tuning voltage.

Next, the fourth order polynomial can be realized using the analog multiplier network of FIG. 3 to linearize the original VCO performance. The four coefficients and constant can be set by adjusting resistors $R_0$ through $R_4$ as follows:

$$c_4 = R_f/R_4;$$

$$c_3 = R_f/R_3;$$

$$c_2 = R_f/R_2;$$

$$c_1 = R_f/R_1;$$

$$c_0 = R_f/R_0(V_{off});$$

$$x = x_{in};$$

and $$y = x_{out}.$$

Figure 6:
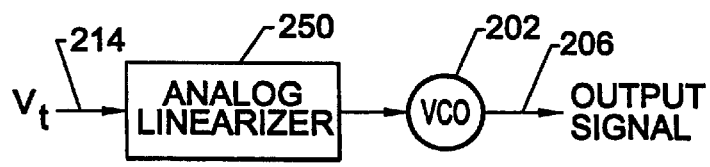
FIG. 6 is a block diagram illustrating a linearized voltage controlled oscillator.

The analog linearizer is then applied to the VCO as shown in FIG. 6.

Given FIG. 6, f versus Vt for the linearized VCO may then be measured. Absolute accuracy and linearity data may then be calculated for the linearized VCO. The resulting absolute accuracy and linearity for the linearized VCQ generally may be seen to be significantly improved. Also, the VCO modulation sensitivity may approach a constant value versus VCO frequency. As shown, applying the analog multiplier linearizer to the phase locked loop can result in an improved linearity and a relatively constant modulation sensitivity versus frequency. As also shown, the fourth order analog multiplier approach can effectively linearize a curve fitted VCO to a straight line with an improvement in linearity for the phase locked loop.

As also shown, the analog linearizer can be constructed using multipliers to achieve a fourth order linearizer equation. This equation is then applied in the analog linearizer to achieve a constant loop bandwidth versus frequency. Thus, a simple and inexpensive solution to realizing a constant loop bandwidth may be provided. The resulting phase locked loop performance can be made constant versus frequency. Thus, the phase noise performance, spurious performance and the settling time can vary less as a function of frequency. As a result of having a constant $\omega_0$ versus frequency, the phase lock loop performance can be predictable and optimized and, therefore, can result in a more predictable and optimized system performance.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A phase locked loop comprising:
    a controlled oscillator that is responsive to a control signal to generate an output signal;
    a divider that divides the output signal to produce a divided output signal;
    a phase detector that is responsive to a reference frequency input signal and to the divided output signal to produce an error signal;
    a loop filter; and
    an analog multiplier network that is configured to equalize the loop bandwidth of the phase locked loop as a function of frequency, wherein the loop filter and the analog multiplier network are serially connected between the phase detector and the controlled oscillator.

2. A phase locked loop according to claim 1 wherein the analog multiplier network equalizes the loop bandwidth of the phase locked loop as a function of frequency to provide constant loop bandwidth for the phase locked loop as a function of frequency.

3. A phase locked loop according to claim 1:
    wherein the loop filter is a two terminal loop filter having a loop filter input terminal and a loop filter output terminal;
    wherein the analog multiplier network is a two terminal analog multiplier network having an analog multiplier network input terminal and an analog multiplier network output terminal; and
    wherein the loop filter input terminal, the loop filter output terminal, the analog multiplier network input terminal and the analog multiplier network output terminal are serially connected between the phase detector and the controlled oscillator.

4. A phase locked loop according to claim 1:
    wherein the divider divides the output signal by a number N that varies as a function of frequency;
    wherein the controlled oscillator has a controlled oscillator sensitivity $K_v$ that varies as a function of frequency; and
    wherein the analog multiplier network compensates for variation of $K_v/N$ as a function of frequency.

5. A phase locked loop comprising:
    a controlled oscillator that is responsive to a control signal to generate an output signal;
    a divider that divides the output signal to produce a divided output signal;
    a phase detector that is responsive to a reference frequency input signal and to the divided output signal to produce an error signal;
    a loop filter, wherein the loop filter, the phase detector, the divider and the controlled oscillator produce a loop bandwidth that varies as a function of frequency; and
    an analog linearizer that equalizes the loop bandwidth as a function of frequency, wherein the loop filter and the analog linearizer are serially connected between the phase detector and the controlled oscillator.

6. A phase locked loop according to claim 5 wherein the analog linearizer comprises an analog multiplier network.

7. A phase locked loop according to claim 5 wherein the analog linearizer equalizes the loop bandwidth as a function of frequency to provide constant loop bandwidth for the phase locked loop as a function of frequency.

8. A phase locked loop according to claim 5:
    wherein the loop filter is a two terminal loop filter having a loop filter input terminal and a loop filter output terminal;
    wherein the analog linearizer is a two terminal analog linearizer having an analog linearizer input terminal and an analog linearizer output terminal; and
    wherein the loop filter input terminal, the loop filter output terminal, the analog linearizer input terminal and the analog linearizer output terminal are serially connected between the phase detector and the controlled oscillator.

9. A phase locked loop according to claim 5:
    wherein the divider divides the output signal by a number N that varies as a function of frequency;
    wherein the controlled oscillator has a controlled oscillator sensitivity $K_v$ that varies as a function of frequency; and
    wherein the analog equalizer compensates for variation of $K_v/N$ as a function of frequency.

10. A phase locked loop comprising:
    controlled oscillating means, responsive to a control signal, for generating an output signal;
    means for dividing the output signal to produce a divided output signal;
    phase detecting means, responsive to a reference frequency input signal and to the divided output signal, for producing an error signal;
    loop filtering means, wherein the loop filtering means, the phase detecting means, the dividing means and the controlled oscillating means produce a loop bandwidth that varies as a function of frequency; and
    analog linearizing means for equalizing the loop bandwidth as a function of frequency, wherein the loop filtering means and the analog linearizing means are serially connected between the phase detecting means and the controlled oscillating means.

11. A phase locked loop according to claim 10 wherein the analog linearizing means comprises an analog multiplier network.

12. A phase locked loop according to claim 10 wherein the analog linearizing means equalizes the loop bandwidth as a function of frequency to provide constant loop bandwidth for the phase locked loop as a function of frequency.

13. A phase locked loop according to claim 10:
    wherein the dividing means comprises means for dividing the output signal by a number N that varies as a function of frequency;
    wherein the controlled oscillating means has a sensitivity $K_v$ that varies as a function of frequency; and
    wherein the analog equalizing means comprises means for compensating for variation of $K_v/N$ as a function of frequency.

* * * * *